United States Patent [19]

McElroy

[11] Patent Number: 5,014,099
[45] Date of Patent: May 7, 1991

[54] DYNAMIC RAM CELL WITH TRENCH CAPACITOR AND TRENCH TRANSISTOR

[75] Inventor: David J. McElroy, Rosenberg, Tex.

[73] Assignee: Texas Instruments Incorporated, Dallas, Tex.

[21] Appl. No.: 494,878

[22] Filed: Mar. 8, 1990

Related U.S. Application Data

[63] Continuation of Ser. No. 198,896, May 26, 1988, abandoned.

[51] Int. Cl.⁵ .................... H01L 29/68; H01L 29/40; H01L 25/04
[52] U.S. Cl. ..................... 357/23.6; 357/53; 357/84; 437/52
[58] Field of Search .............. 357/23.6, 53, 84; 437/52

[56] References Cited

U.S. PATENT DOCUMENTS

| | | | |
|---|---|---|---|
| 4,651,184 | 3/1987 | Malhi | 357/41 |
| 4,751,558 | 6/1988 | Kenney | 357/23.6 |
| 4,830,978 | 5/1989 | Teng et al. | 357/23.6 |
| 4,916,524 | 4/1990 | Teng et al. | 357/23.6 |

FOREIGN PATENT DOCUMENTS

| | | | |
|---|---|---|---|
| 073657 | 4/1987 | Japan | 437/52 |
| 009965 | 1/1988 | Japan | 437/52 |

Primary Examiner—Rolf Hille
Assistant Examiner—Robert P. Limanek
Attorney, Agent, or Firm—James C. Kesterson; James T. Comfort; Melvin Sharp

[57] ABSTRACT

A dynamic random access memory cell has a storage capacitor and an access transistor formed on the sidewalls of a trench etched into the face of a silicon bar. The storage capacitor uses the sidewalls of the trench as the storage node, and uses a polysilicon plug as a common or grounded node. This polysilicon plug is part of a grounded field plate that surrounds the cell on the face and functions to provide isolation between cells. The channel of the access transistor is formed in a minor trench using the upper part of the sidewall of only one side of the major trench; an upper edge of the capacitor storage node functions as the source region of the transistor, while a buried N+ region on the face adjacent the trench is the drain. The gate of the transistor is a conductor extending along the face over the field plate except where it extends down into the minor trench at the channel area.

9 Claims, 1 Drawing Sheet

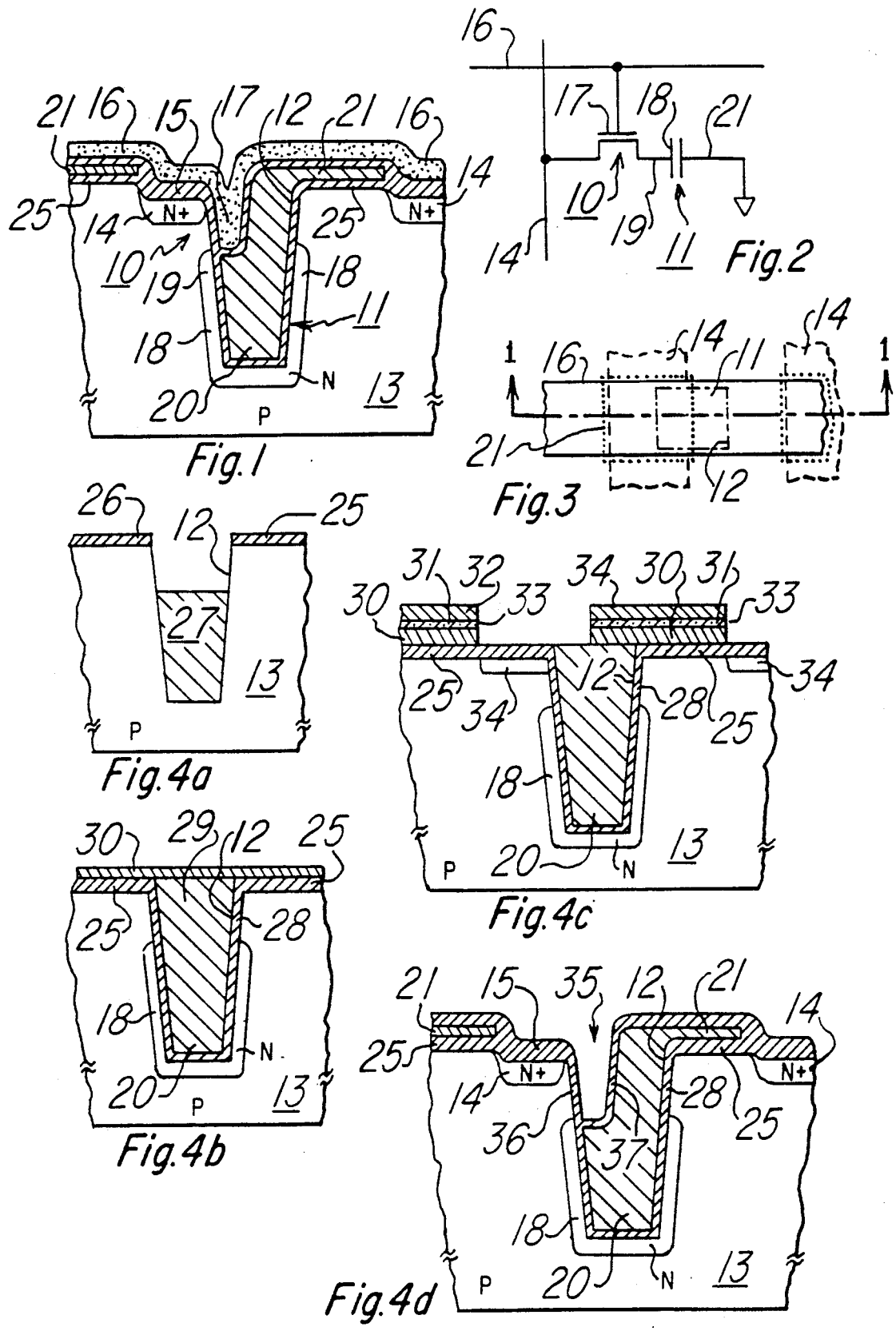

DYNAMIC RAM CELL WITH TRENCH CAPACITOR AND TRENCH TRANSISTOR

This application is a continuation of application Ser. No. 196,896, filed May 26, 1988, now abandoned.

BACKGROUND OF THE INVENTION

This invention relates to semiconductor devices and methods of making such devices, and more particularly to a dynamic random access memory cell and a process for manufacturing the cell.

Dynamic RAM cells in which both the capacitor and the transistor are located within a trench in the face of a silicon bar are disclosed by Richardson, et al, in Proceedings of the International Electronic Devices Meeting, IEEE, 1985, pp. 714-717; this structure greatly reduces the space occupied on the face of the bar, and so the density of cells can be very high. These cells require the use of a buried lateral contact to connect the source of the access transistor to the upper plate of the capacitor which forms the storage node, and the manufacturing steps for forming this contact are complex. Cells have been proposed such as that in U.S. Pat. No. 4,225,945 issued to Kuo and assigned to Texas Instruments, in which the capacitor and transistor are located within a trench, and in which the lower capacitor plate is the storage node, so the edge of the capacitor region forms the source of the access transistor and so no buried contact is needed.

It is the principal object of this invention to provide an improved dynamic memory cell of the type having both the capacitor and the access transistor located within a trench to thereby reduce the space used on the surface. It is another object to provide a trench-type dynamic memory cell which is more easily manufactured with existing process technology, particularly one that does not require a buried lateral contact.

SUMMARY OF THE INVENTION

In accordance with one embodiment of the invention a dynamic random access memory cell has a storage capacitor and an access transistor formed on the sidewalls of a trench etched into the face of a semiconductor bar. The storage capacitor uses the sidewalls of the trench as the storage node, and uses a polysilicon plug as a common node. This polysilicon plug is part of a field plate that surrounds the cell on the face and functions to provide isolation between cells; this type of isolation reduces crystal lattice defects, compared with thick field oxide or so-called LOCOS isolation. The channel of the access transistor is formed in the upper part of the sidewall of only a portion of the trench, using an upper edge of the capacitor storage node as the source region of the transistor and having a buried N+ drain region on the face. The gate of the transistor is a conductor extending along the face over the field plate except where it extends down into the trench at the channel area.

BRIEF DESCRIPTION OF THE DRAWINGS

The novel features believed characteristic of the invention are set forth in the appended claims. The invention itself, however, as well as further objects and advantages thereof, will best be understood by reference to the following detailed description of particular embodiments, when read in conjunction with the accompanying drawings, wherein:

FIG. 1 is an elevation view in section of a dynamic memory cell according to one embodiment of the invention;

FIG. 2 is an electrical schematic diagram of the cell of FIG. 1;

FIG. 3 is a plan view of the cell of FIG. 1, in which FIG. 1 is a section taken along the lines 1—1 of FIG. 2; and FIGS. 4a-4d are section views like FIG. 1 a various stages of manufacture of the cell of FIGS. 1-3.

DETAILED DESCRIPTION OF SPECIFIC EMBODIMENTS

FIG. 1 is a section view of a one-transistor dynamic random access memory cell having a transistor 10 and a capacitor 11 formed within a trench 12 in the face of a silicon bar 13, and this same cell is seen in schematic diagram form in FIG. 2 and in plan view in FIG. 3. An N+ region 14 buried beneath a layer of silicon oxide 15 forms the bitline for the cell and forms the drain of the access transistor 10. An elongated polysilicon strip 16 is the wordline, which extends down into a recess in the trench 12 to create the gate 17 of the transistor. An N-type region 18 formed in the sidewall of the lower part of the trench 12 is the storage node of the capacitor 11, and an upper edge of this N-type region also creates the source region of 19 the transistor 10. A polysilicon plug 20 fills the trench 12 except where the gate 17 is created, and this plug is part of a field plate 21 extending over the face of the cell array; this field plate may be grounded as disclosed in my U.S. Pat. No. 4,345,364, or may have a voltage of about one-half Vdd applied to it for the reasons explained in U.S. Pat. No. 4,240,092.

A method of making the cell of FIGS. 1-3 will be described with reference to FIGS. 4a-4d. The starting material is a slice of P-type semiconductor-grade single-crystal silicon of which the bar 13 is only a very minute part; the cell of FIG. 1 is of course only one of 4-Meg or 16-Meg on a bar, and perhaps several hundred bars would be formed on a slice at one time. Only the steps used to create the cell array will be described, it being understood that the periphery of the device would be made using CMOS processing as is usual at the present time, or in addition bipolar devices may be included as well. First, a coating 25 of silicon oxide is created as seen in FIG. 4a, by exposing the slice to steam at an elevated temperature; a silicon nitride layer may be added over the oxide layer 25 to prevent the oxide 25 from being etched away at some stages of the process. An opening 26 is created in the oxide 25 by photoresist masking and etching, to leave exposed the area where the trench is to be etched. The slice is now subjected to a reactive ion etch to create the trench 12, to a depth of perhaps 5 to 10 microns; the area of the trench at the face is about 2×2 microns or less. The next step is creation of the N+ region 18 by first coating the entire face with a deposited, doped silicon oxide, then subjecting the face to a uniform reactive ion etch to remove all of this oxide except a plug 27 in the trench; an oxide cap might be added to prevent outdiffusion from doping the upper walls, and then the slice is subjected to a high temperature for a time sufficient to diffuse N-type impurity such as phosphorous or arsenic from the oxide plug 27 into the sidewalls of the trench to form the N-type capacitor region 18. An etch is now performed to remove the oxide plug 27, but the original oxide stays in place as it is protected by nitride or because a selective etch is used. As seen in FIG. 4b, a thin oxide is now grown to form the capacitor dielectric 28; this dielectric may be thermal silicon oxide at about 100 to 150 Å thickness, for example, or it may be a combination of thermal silicon oxide and an added coating of silicon nitride, creating an effective dielectric thickness of about 100 Å. Doped polysilicon 29 is now deposited to cover the entire face and to fill the trench 12, then this polysilicon is etched back using a reactive ion etch to expose the original oxide 25; that is, the etching of the polysilicon 29 is performed to stop when the level of the oxide 25 is reached. Then, another coating 30 of polycrystalline silicon is deposited on the face of the slice to a thickness suitable for the field plate 21. The reason for this two-step process of depositing polysilicon at this point is merely to assure that the thickness of the field plate is properly defined, which would not be very compatible with the requirement of filling the trench if done in a single step. Turning now to FIG. 4c, the next step is to deposit or grow an oxide coating 31 over the field plate polysilicon 30, which will serve to insulate the wordline 16 from the field plate. A photoresist mask 32 is added over this oxide 31 to define an opening 33 of the shape of the bitline 14, and using this mask an etch is done to remove the oxide 31 and the polysilicon 30, stopping at the level of the original oxide 25. An arsenic implant is now performed, penetrating the oxide 25, to create an arsenic-implanted region 34 where the bitline 14 is to be. Turning next to FIG. 4d, after the arsenic implant an etch using the masking of FIG. 4c is continued to remove the polysilicon plug 29 at the edge where the transistor 10 is being formed, down to the level of the N-type implanted region 18, creating a smaller trench or recess 35 within the original trench 12. After this etch, a dip-out etch is used to remove the oxide 28 where the transistor channel is to be created, and to remove the oxide 25 over the arsenic-implanted region 34. The slice is then subjected to an oxidization which will grow thick oxide 15 preferentially on the heavily-doped silicon of the arsenic-implanted region 34 but thin oxide 36 on the relatively undoped transistor channel area; at the same time, an oxide coating 37 grows on the exposed polysilicon 29 in the trench 35 to serve to insulate the wordline 16 from the plug 20. Fabrication of the cell is completed by then depositing a polysilicon layer and patterning it to form the wordline 16 as seen in FIGS. 1 and 3; alternatively, instead of using a polysilicon wordline, a metal or silicided-polysilicon wordline may be employed.

While this invention has been described with reference to illustrative embodiments, this description is not meant to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A one-transistor dynamic random-access memory cell formed in the face of a monocrystalline semiconductor body of a first conductivity type comprising:
   a trench region having a bottom portion in the semiconductor body and a wall portion extending from the face into the semiconductor body to the bottom portion;
   a first capacitor region of a second conductivity type formed along the trench wall portion and extending from the bottom portion to a position along the wall portion and spaced from the face of the semiconductor body;
   a conductive plug filling most of the trench;
   a conductive layer formed over and in electrical contact with the conductive plug, said layer extending away from the trench region and positioned between the wordline and the face to provide a field plate over a portion of the face adjoining the trench region;
   a dielectric material providing electrical isolation between the capacitor region and the conductive plug;
   a first source/drain region of the second conductivity type formed in the semiconductor body on the face or on the wall portion, said first source/drain region separated from the first capacitor region by a channel region or the first conductivity type along the wall portion, a portion of the first capacitor region including a second source/drain region adjoining the channel region;
   a minor recess formed in the trench adjacent the channel region and extending from the face to the first capacitor region; and
   a wordline along the face and including a gate layer positioned in the recess to selectively render the channel region conductive.

2. The memory cell of claim 1 further including an insulative layer positioned between the channel region and the gate layer.

3. The memory cell of claim 1 wherein the first conductivity type is P-type.

4. The memory cell of claim 1 wherein the conductive plug is formed of polysilicon.

5. A memory comprising a plurality of memory cells formed in a semiconductor layer of a first conductivity type, each of said cells including a storage capacitor and an access transistor at least partially formed in a trench and each cell further comprising:
   a first capacitor region of a second conductivity type formed along the bottom portion of said trench wall and spaced from the face of said semiconductor layer;
   a conductive plug filling most of the trench;
   a conductive reference plate in electrical contact with said conductive plug and extending away from said trench region and over said semiconductor layer to provide a field plate adjacent said trench;
   a dielectric material providing electrical isolation between said capacitor region and said conductive plug; and
   a transistor formed along a sidewall of said trench.

6. The memory of claim 5, wherein:
   said first capacitor region is formed as a doped region in the sidewalls of said trench, and a portion of said doped region further serves as a source/drain region of a corresponding one of said transistor.

7. The memory of claim 5, wherein:
   said transistor has a channel region in said sidewall and an insulated gate formed by a conductive layer over said semiconductor layer and extending into a portion of said trench.

8. The memory of claim 5, wherein:
   (a) said semiconductor layer is silicon;
   (b) said transistor is a MOSFET; and
   (c) said reference plate is polysilicon.

9. The memory of claim 5, wherein:
   said reference plate is connected to a reference plate of another one of said cells to form a single layer with openings for said transistors.

* * * * *